US011221900B2

United States Patent
Choi et al.

(10) Patent No.: US 11,221,900 B2
(45) Date of Patent: Jan. 11, 2022

(54) SEMICONDUCTOR DEVICE FOR PERFORMING AN ERROR CHECK OPERATION

(71) Applicant: SK hynix Inc., Icheon-si (KR)

(72) Inventors: Geun Ho Choi, Icheon-si (KR); Sun Myung Choi, Seoul (KR)

(73) Assignee: SK hynix Inc., Icheon-si (KR)

( * ) Notice: Subject to any disclaimer, the term of this patent is extended or adjusted under 35 U.S.C. 154(b) by 128 days.

(21) Appl. No.: 16/589,984

(22) Filed: Oct. 1, 2019

(65) Prior Publication Data

US 2020/0285532 A1    Sep. 10, 2020

(30) Foreign Application Priority Data

Mar. 5, 2019   (KR) .................. 10-2019-0025317

(51) Int. Cl.
| | | |
|---|---|---|
| *G06F 11/00* | (2006.01) | |
| *G06F 11/07* | (2006.01) | |
| *G11C 7/22* | (2006.01) | |
| *G11C 7/10* | (2006.01) | |
| *G11C 8/10* | (2006.01) | |

(52) U.S. Cl.
CPC ...... *G06F 11/0751* (2013.01); *G06F 11/0727* (2013.01); *G06F 11/0772* (2013.01); *G11C 7/106* (2013.01); *G11C 7/222* (2013.01); *G11C 8/10* (2013.01)

(58) Field of Classification Search
None
See application file for complete search history.

(56) References Cited

U.S. PATENT DOCUMENTS

| | | | | |
|---|---|---|---|---|
| 8,612,841 | B2* | 12/2013 | Park | G06F 11/1004 |
| | | | | 714/807 |
| 2011/0058445 | A1* | 3/2011 | Fujisawa | G11C 7/02 |
| | | | | 365/233.1 |
| 2012/0144278 | A1* | 6/2012 | Park | G06F 11/1004 |
| | | | | 714/807 |
| 2020/0372958 | A1* | 11/2020 | Kasai | G11C 7/22 |
| 2020/0379840 | A1* | 12/2020 | Lee | G06F 11/0793 |
| 2020/0394103 | A1* | 12/2020 | Schaefer | G06F 11/0772 |

FOREIGN PATENT DOCUMENTS

KR         101198250 B1    11/2012

OTHER PUBLICATIONS

Google Scholar/Patents—text refined (Year: 2021).*
Hong Gyeom Kim, et al., "Semiconductor Device", Application No. 2018-0047008, Apr. 23, 2018, pp. 1-59, SK hynix Inc., Republic of Korea.

* cited by examiner

*Primary Examiner* — Christopher S McCarthy
(74) *Attorney, Agent, or Firm* — William Park & Associates Ltd.

(57) ABSTRACT

A semiconductor device includes an error detection circuit configured to generate fixed data by fixing any one of a first group and a second group included in internal data to a preset level based on a burst chop signal and an internal command address in response to a read command, and generate an error detection signal by detecting an error of the fixed data; and a data output circuit configured to generate latch data by latching the internal data based on a first latch output control signal, and generate output data by serializing the latch data and the error detection signal based on a second latch output control signal.

24 Claims, 8 Drawing Sheets

SEMICONDUCTOR DEVICE FOR PERFORMING AN ERROR CHECK OPERATION

CROSS-REFERENCE TO RELATED APPLICATION

The present application claims priority under 35 U.S.C. § 119(a) to Korean Patent Application No. 10-2019-0025317 filed on Mar. 5, 2019 in the Korean Intellectual Property Office, which is incorporated herein by reference in its entirety.

BACKGROUND

1. Technical Field

Embodiments of the disclosure may generally relate to a semiconductor device configured for performing an error check operation.

2. Related Art

Recently, in order to increase the operating speed of a semiconductor device, a scheme of inputting/outputting a plurality of data in each clock cycle is used. In the case where an input/output speed of data is increased, the probability of an error to occur during a data transmission process also increases. Therefore, a separate device and method for ensuring the reliability of data transmission are additionally demanded.

There is used a method of generating error codes capable of checking the occurrence of an error and transmitting the error codes together with data, at each time of transmitting data, thereby ensuring the reliability of data transmission. The error codes include a cyclic redundancy check (CRC) code and an error detection code (EDC) capable of detecting an occurred error and an error correction code (ECC) capable of self-correcting an error when it has occurred.

SUMMARY

In an embodiment, a semiconductor device may include: an error detection circuit configured to generate fixed data by fixing any one of a first group and a second group included in internal data to a preset level based on a burst chop signal and an internal command address in response to a read command, and generate an error detection signal by detecting an error of the fixed data; and a data output circuit configured to generate latch data by latching the internal data based on a first latch output control signal, and generate output data by serializing the latch data and the error detection signal based on a second latch output control signal.

In an embodiment, a semiconductor device may include: a command decoder configured to generate a read command and a burst chop signal by decoding a chip select signal and a command address, and generate an internal command address based on the command address; an error detection circuit configured to fix any one of a first group and a second group included in internal data to a preset level based on the burst chop signal and the internal command address in response to the read command, and generate an error detection signal based on a detection of an error within the internal data; and a data output circuit configured to generate output data by serializing the internal data and the error detection signal after a read latency period.

DETAILED DESCRIPTION

Hereinafter, a semiconductor device will be described below with reference to the accompanying drawings through various examples of embodiments.

Various embodiments may be directed to a semiconductor device which generates a signal for performing a burst chop operation from a command address in a read operation and performs in parallel the burst chop operation and an error check operation.

According to the embodiments of the disclosure, it may be possible to provide a semiconductor device which generates a signal for performing a burst chop operation from a command address in a read operation and performs in parallel the burst chop operation and an error check operation.

Figure 1:
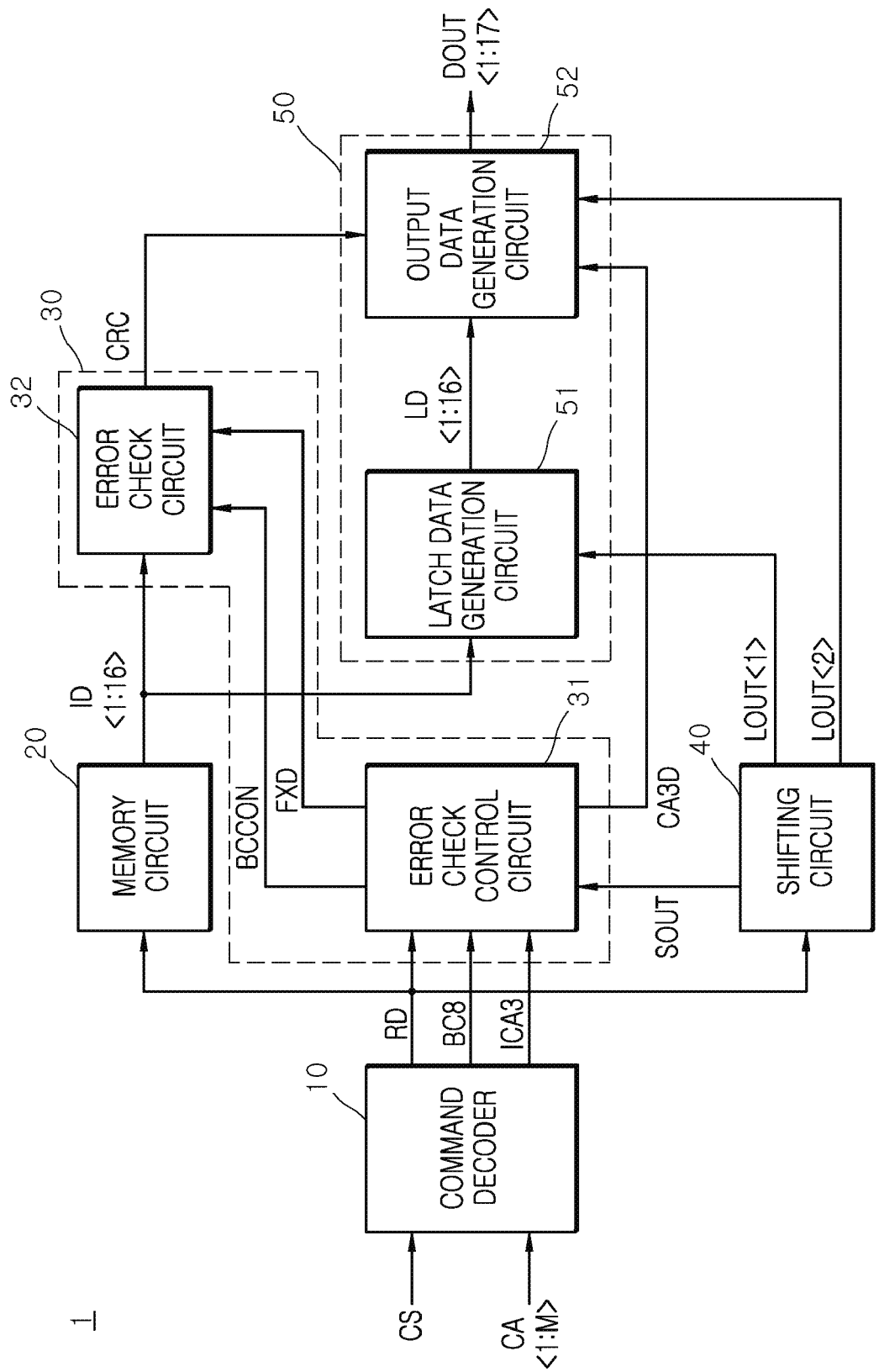
FIG. 1 is a block diagram illustrating a representation of an example of the configuration of a semiconductor device in accordance with an embodiment of the disclosure.

As illustrated in FIG. 1, a semiconductor device 1 in accordance with an embodiment of the disclosure may include a command decoder 10, a memory circuit 20, an error detection circuit 30, a shifting circuit 40 and a data output circuit 50.

The command decoder 10 may decode a chip select signal CS and first to M^th command addresses CA<1:M> and thereby generate a read command RD and a burst chop signal BC8. The command decoder 10 may generate the read command RD which is enabled, in the case where the chip select signal CS and the first to M^th command addresses CA<1:M> are a logic level combination for a read operation. The command decoder 10 may generate the burst chop signal BC8 which is enabled, in the case where the chip select signal CS and the first to M^th command addresses CA<1:M> are a logic level combination for a burst chop operation. The command decoder 10 may generate the read command RD and the burst chop signal BC8 which are simultaneously enabled, in the case where the chip select signal CS and the first to M^th command addresses CA<1:M> are a logic level combination for simultaneously performing the read operation and the burst chop operation. The command decoder 10 may generate an internal command address ICA3 from any one among the bits included in the first to M^th command addresses CA<1:M>, in the burst chop operation. The number of bits included in the first to M^th command addresses CA<1:M> may be set variously depending on an embodiment. The read command RD may be set as a command which is enabled to output first to sixteenth internal data ID<1:16> stored in the memory circuit 20. The burst chop signal BC8 may be set as a signal which is enabled to enter the burst chop operation for fixing any one of a first group ID<1:8> and a second group ID<9:16> of the first to sixteenth internal data ID<1:16> to a preset level. The burst chop operation may be set as an operation that fixes and thereby does not use bits except the number of data bits necessary when performing an error check operation by an error check control circuit 31 in accordance with an embodiment of the disclosure. While an embodiment of the disclosure is realized such that 8-bit data is required in the burst chop operation, it is to be noted that the number of data bits required in the burst chop operation may be set variously depending on an embodiment. The word "preset" as used herein with respect to a parameter, such as a preset level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The memory circuit 20 may be realized by a plurality of memory cell arrays (not illustrated). The memory circuit 20 may output the stored first to sixteenth internal data ID<1:16> in the case where the read command RD is inputted. The number of bits included in the first to sixteenth internal data ID<1:16> may be set variously depending on an embodiment. The case where the first to sixteenth internal data ID<1:16> are set to 16 bits may be set to a case where a burst length is set to 16 such that the first to sixteenth internal data ID<1:16> of 16 bits are outputted when the read command RD is inputted once.

The error detection circuit 30 may include the error check control circuit 31 and an error check circuit 32.

The error check control circuit 31 may latch the burst chop signal BC8 and the internal command address ICA3 at a time when the read command RD is inputted. The error check control circuit 31 may output the latched burst chop signal BC8 and internal command address ICA3 as an operation control signal BCCON and a data control signal FXD after the time when the read command RD is inputted. The error check control circuit 31 may generate a delay command address CA3D from the latched internal command address ICA3 at a time when a shifting output signal SOUT is inputted.

The error check circuit 32 may detect an error of the first to sixteenth internal data ID<1:16> depending on the operation control signal BCCON and the data control signal FXD and thereby generate an error detection signal CRC. The error check circuit 32 may fix any one of the first group ID<1:8> and the second group ID<9:16> of the first to sixteenth internal data ID<1:16> to the preset level depending on the logic level of the data control signal FXD in the case where the operation control signal BCCON is enabled, detect an error of the first to sixteenth internal data ID<1:16>, and thereby generate the error detection signal CRC. The error check circuit 32 may fix the first group ID<1:8> of the first to sixteenth internal data ID<1:16> to the preset level (a logic low level) in the case where the data control signal FXD is a logic low level (a first logic level). The error check circuit 32 may fix the second group ID<9:16> of the first to sixteenth internal data ID<1:16> to the preset level (the logic low level) in the case where the data control signal FXD is a logic high level (a second logic level). Further, the logic levels of the signals may be different from or the opposite of those described. For example, a signal described as having a logic "high" level may alternatively have a logic "low" level, and a signal described as having a logic "low" level may alternatively have a logic "high" level.

The error detection circuit 30 configured as mentioned above may fix any one of the first group ID<1:8> and the second group ID<9:16> included in the first to sixteenth internal data ID<1:16> to the preset level by the burst chop signal BC8 and the internal command address ICA3 in the case where the read command RD is inputted, detect an error of the first to sixteenth internal data ID<1:16>, and thereby generate the error detection signal CRC.

The shifting circuit 40 may receive the read command RD and generate the shifting output signal SOUT, a first latch output control signal LOUT<1> and a second latch output control signal LOUT<2>. The shifting circuit 40 may shift the read command RD and thereby generate the shifting output signal SOUT which is enabled. The shifting circuit 40 may shift the read command RD and thereby generate the first latch output control signal LOUT<1> which is enabled. The shifting circuit 40 may shift the read command RD and thereby generate the second latch output control signal LOUT<2> which is enabled. A period for shifting the second latch output control signal LOUT<2> may be set as a read latency period. The read latency period may be set as a period longer than a period during which an error of the first to sixteenth internal data ID<1:16> is detected, from a time when the read command RD is generated. Periods for shifting the shifting output signal SOUT and the first latch output control signal LOUT<1> may be set as periods shorter than the read latency period.

The data output circuit 50 may include a latch data generation circuit 51 and an output data generation circuit 52.

The latch data generation circuit 51 may latch the first to sixteenth internal data ID<1:16> and thereby generate first to sixteenth latch data LD<1:16>, in the case where the first latch output control signal LOUT<1> is inputted. The latch data generation circuit 51 may be realized by a plurality of pipe circuits (not illustrated), latch the first to sixteenth internal data ID<1:16>, and output the latched first to sixteenth internal data ID<1:16> as the first to sixteenth latch data LD<1:16>.

The output data generation circuit 52 may serialize the first to sixteenth latch data LD<1:16> and the error detection signal CRC depending on the delay command address CA3D and thereby generate first to seventeenth output data DOUT<1:17>, in the case where the second latch output control signal LOUT<2> is inputted. The first to sixteenth output data DOUT<1:16> may be generated from the first to sixteenth latch data LD<1:16>, and the seventeenth output data DOUT<17> may be generated from the error detection signal CRC.

The operation of generating the first to sixteenth output data DOUT<1:16> in the output data generation circuit 52 may be described below as follows.

The output data generation circuit 52 may generate the first to sixteenth output data DOUT<1:16> without changing the sequence of the first to sixteenth latch data LD<1:16>, in the case where the second latch output control signal LOUT<2> is inputted and the delay command address CA3D is a logic low level.

The output data generation circuit 52 may generate the first to sixteenth output data DOUT<1:16> by changing the sequence of the first to sixteenth latch data LD<1:16>, in the case where the second latch output control signal LOUT<2> is inputted and the delay command address CA3D is a logic high level. For example, in the case where the second latch output control signal LOUT<2> is inputted and the delay command address CA3D is the logic high level, the output data generation circuit 52 may output the first to eighth latch data LD<1:8> of the first to sixteenth latch data LD<1:16> as the ninth to sixteenth output data DOUT<9:16> and output the ninth to sixteenth latch data LD<9:16> of the first to sixteenth latch data LD<1:16> as the first to eighth output data DOUT<1:8>. The operation of outputting the first to sixteenth output data DOUT<1:16> by changing the sequence of the bits included in the first to sixteenth latch data LD<1:16> in the output data generation circuit 52 may be set variously depending on an embodiment.

The output data generation circuit 52 may generate the seventeenth output data DOUT<17> from the error detection signal CRC after generating the first to sixteenth output data DOUT<1:16>.

The data output circuit 50 configured as mentioned above may generate the first to seventeenth output data DOUT<1:17> by serializing the first to sixteenth internal data ID<1:16> and the error detection signal CRC after the read latency period.

Figure 2:
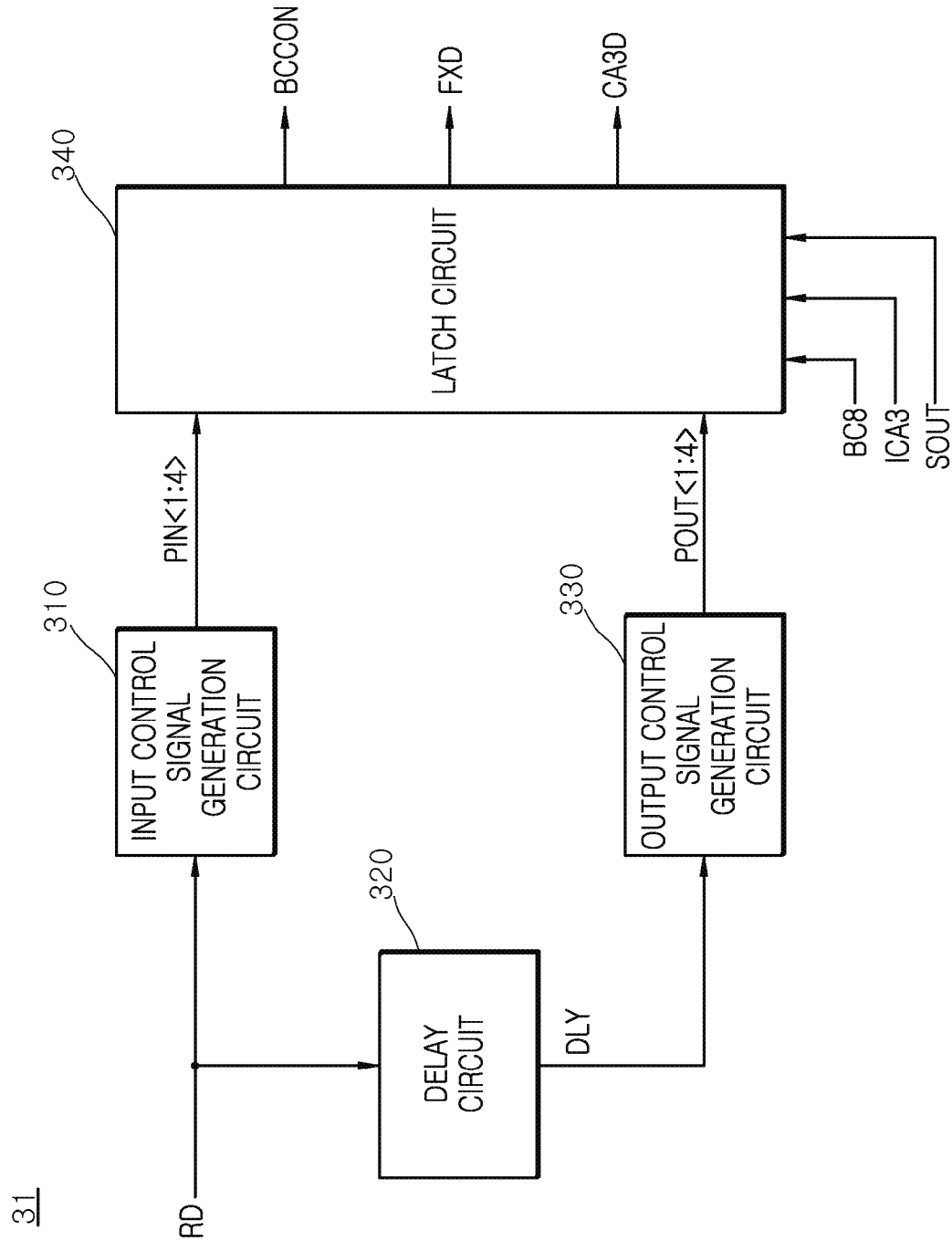
FIG. 2 is a block diagram illustrating a representation of an example of the configuration of the error check control circuit included in the error detection circuit illustrated in FIG. 1.

Referring to FIG. 2, the error check control circuit 31 may include an input control signal generation circuit 310, a delay circuit 320, an output control signal generation circuit 330 and a latch circuit 340.

The input control signal generation circuit 310 may generate first to fourth input control signals PIN<1:4> which are sequentially enabled from a first logic level combination, in the case where the read command RD is inputted. The input control signal generation circuit 310 may generate the first to fourth input control signals PIN<1:4> of the first logic level combination in an initializing operation of the semiconductor device 1. The first logic level combination will be described later through FIG. 3.

The delay circuit 320 may delay the read command RD and thereby generate a delay signal DLY. A delay amount for delaying the read command RD may be set variously depending on an embodiment.

The output control signal generation circuit 330 may generate first to fourth output control signals POUT<1:4> which are sequentially enabled from a second logic level combination, in the case where the delay signal DLY is inputted. The output control signal generation circuit 330 may generate the first to fourth output control signals POUT<1:4> of the second logic level combination in the initializing operation of the semiconductor device 1. The second logic level combination will be described later through FIG. 4.

The latch circuit 340 may latch the burst chop signal BC8 and the internal command address ICA3 in the case where the first to fourth input control signals PIN<1:4> are inputted. The latch circuit 340 may output the latched burst chop signal BC8 and internal command address ICA3 as the operation control signal BCCON and the data control signal FXD in the case where the first to fourth output control signals POUT<1:4> are inputted. The latch circuit 340 may output the latched burst chop signal BC8 as the operation control signal BCCON in the case where the first to fourth output control signals POUT<1:4> are inputted. The latch circuit 340 may output the latched internal command address ICA3 as the data control signal FXD in the case where the first to fourth output control signals POUT<1:4> are inputted. The latch circuit 340 may output the latched internal command address ICA3 as the delay command address CA3D in the case where the shifting output signal SOUT is inputted.

While the first to fourth input control signals PIN<1:4> and the first to fourth output control signals POUT<1:4> are each illustrated as four bits to explain the first logic level combination and the second logic level combination, it is to be noted that they may be set to various numbers of bits depending on an embodiment.

Figure 3:
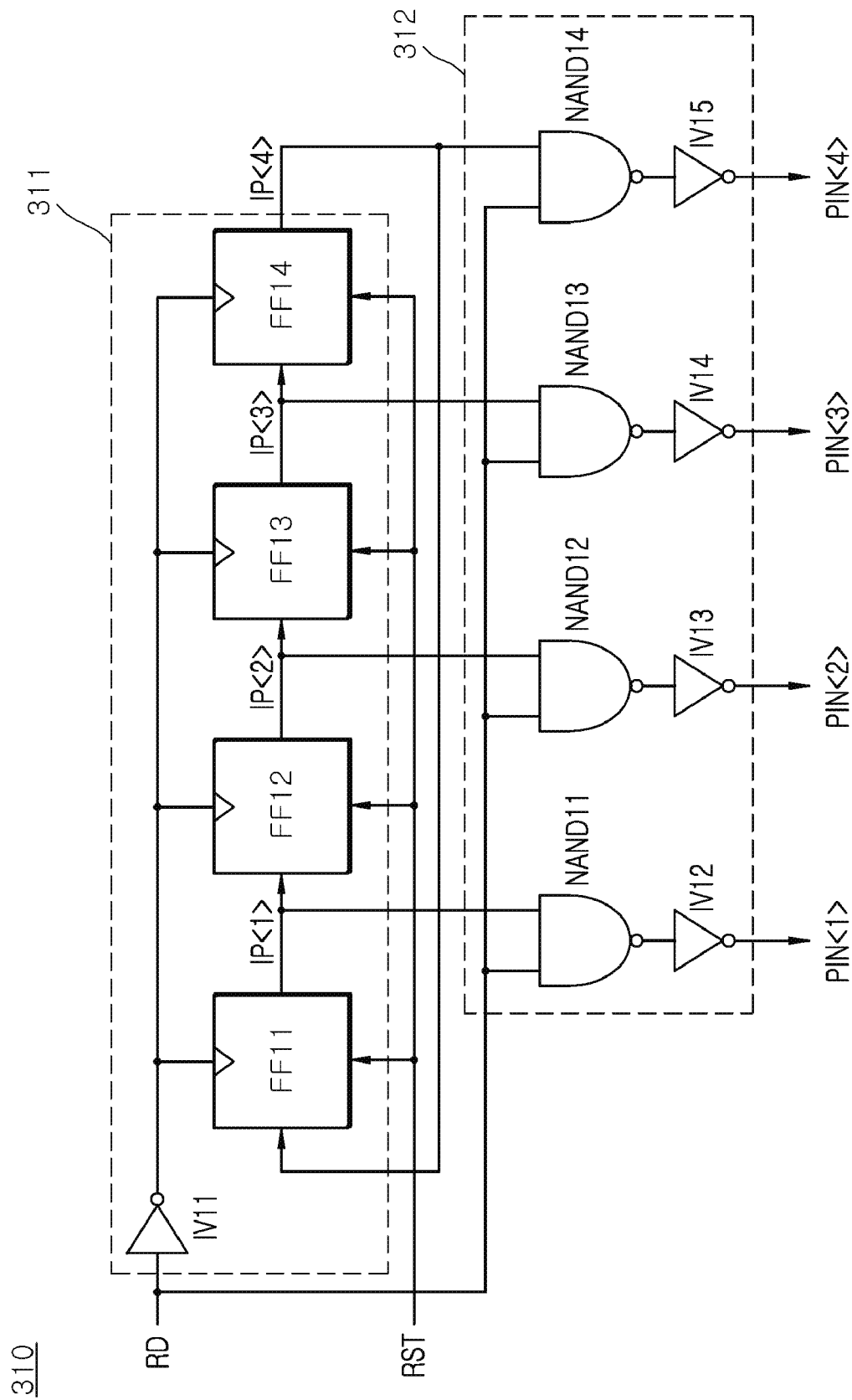
FIG. 3 is a diagram illustrating a representation of an example of the configuration of the input control signal generation circuit included in the error check control circuit illustrated in FIG. 2.

Referring to FIG. 3, the input control signal generation circuit 310 may include an internal pulse generation circuit 311 and an input control signal output circuit 312.

The internal pulse generation circuit 311 may be realized by an inverter IV11 and flip-flops FF11, FF12, FF13 and FF14.

The inverter IV11 may invert and buffer the read command RD and output an output signal.

The flip-flop FF11 may generate a first internal pulse IP<1> which is initialized to a logic high level, in the case where a reset signal RST is enabled. The flip-flop FF11 may output a fourth internal pulse IP<4> as the first internal pulse IP<1>, in the case where the output signal of the inverter IV11 is a logic low level.

The flip-flop FF12 may generate a second internal pulse IP<2> which is initialized to a logic low level, in the case where the reset signal RST is enabled. The flip-flop FF12 may output the first internal pulse IP<1> as the second internal pulse IP<2>, in the case where the output signal of the inverter IV31 is the logic low level.

The flip-flop FF13 may generate a third internal pulse IP<3> which is initialized to a logic low level, in the case where the reset signal RST is enabled. The flip-flop FF13 may output the second internal pulse IP<2> as the third internal pulse IP<3>, in the case where the output signal of the inverter IV11 is the logic low level.

The flip-flop FF14 may generate the fourth internal pulse IP<4> which is initialized to a logic low level, in the case where the reset signal RST is enabled. The flip-flop FF14 may output the third internal pulse IP<3> as the fourth internal pulse IP<4>, in the case where the output signal of the inverter IV11 is the logic low level.

The reset signal RST may be set as a signal which is enabled in the initializing operation where the semiconductor device 1 first performs an operation.

The input control signal output circuit 312 may be realized by logic gates, for example but not limited to, NAND gates NAND11, NAND12, NAND13 and NAND14 and inverters IV12, IV13, IV14 and IV15.

The NAND gate NAND11 and the inverter IV12 may buffer the first internal pulse IP<1> and thereby generate the first input control signal PIN<1>, in the case where the read command RD is a logic high level.

The NAND gate NAND12 and the inverter IV13 may buffer the second internal pulse IP<2> and thereby generate the second input control signal PIN<2>, in the case where the read command RD is the logic high level.

The NAND gate NAND13 and the inverter IV14 may buffer the third internal pulse IP<3> and thereby generate the third input control signal PIN<3>, in the case where the read command RD is the logic high level.

The NAND gate NAND14 and the inverter IV15 may buffer the fourth internal pulse IP<4> and thereby generate the fourth input control signal PIN<4>, in the case where the read command RD is the logic high level.

The above-described first logic level combination means a logic level combination in which the first input control signal PIN<1> is generated at a logic high level, the second input control signal PIN<2> is generated at a logic low level, the third input control signal PIN<3> is generated at a logic low level and the fourth input control signal PIN<4> is generated at a logic low level.

Figure 4:
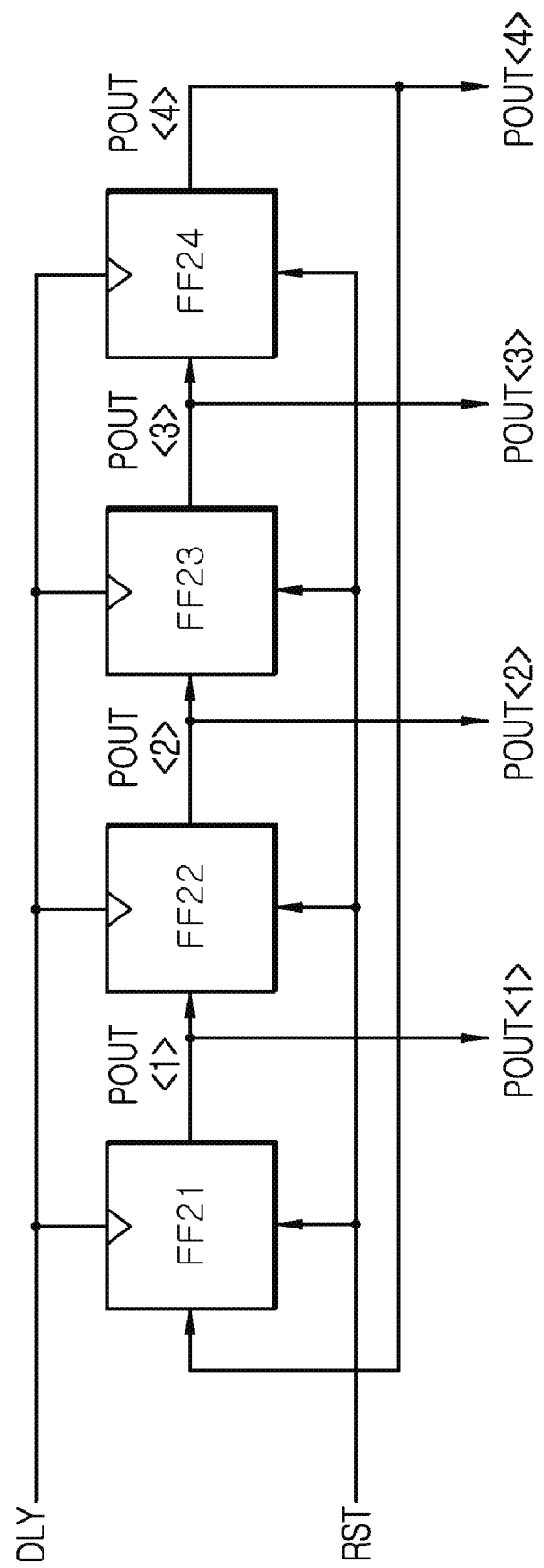
FIG. 4 is a diagram illustrating a representation of an example of the configuration of the output control signal generation circuit included in the error check control circuit illustrated in FIG. 2.

Referring to FIG. 4, the output control signal generation circuit 330 may be realized by flip-flops FF21, FF22, FF23 and FF24.

The flip-flop FF21 may generate the first output control signal POUT<1> which is initialized to a logic high level, in the case where the reset signal RST is enabled. The flip-flop FF21 may output the fourth output control signal POUT<4> as the first output control signal POUT<1>, in the case where the delay signal DLY is a logic high level.

The flip-flop FF22 may generate the second output control signal POUT<2> which is initialized to a logic low level, in the case where the reset signal RST is enabled. The flip-flop FF22 may output the first output control signal POUT<1> as the second output control signal POUT<2>, in the case where the delay signal DLY is the logic high level.

The flip-flop FF23 may generate the third output control signal POUT<3> which is initialized to a logic low level, in the case where the reset signal RST is enabled. The flip-flop FF23 may output the second output control signal POUT<2> as the third output control signal POUT<3>, in the case where the delay signal DLY is the logic high level.

The flip-flop FF24 may generate the fourth output control signal POUT<4> which is initialized to a logic low level, in the case where the reset signal RST is enabled. The flip-flop FF24 may output the third output control signal POUT<3> as the fourth output control signal POUT<4>, in the case where the delay signal DLY is the logic high level.

The above-described second logic level combination means a logic level combination in which the first output control signal POUT<1> is generated at the logic high level, the second output control signal POUT<2> is generated at the logic low level, the third output control signal POUT<3> is generated at the logic low level and the fourth output control signal POUT<4> is generated at the logic low level.

Figure 5:
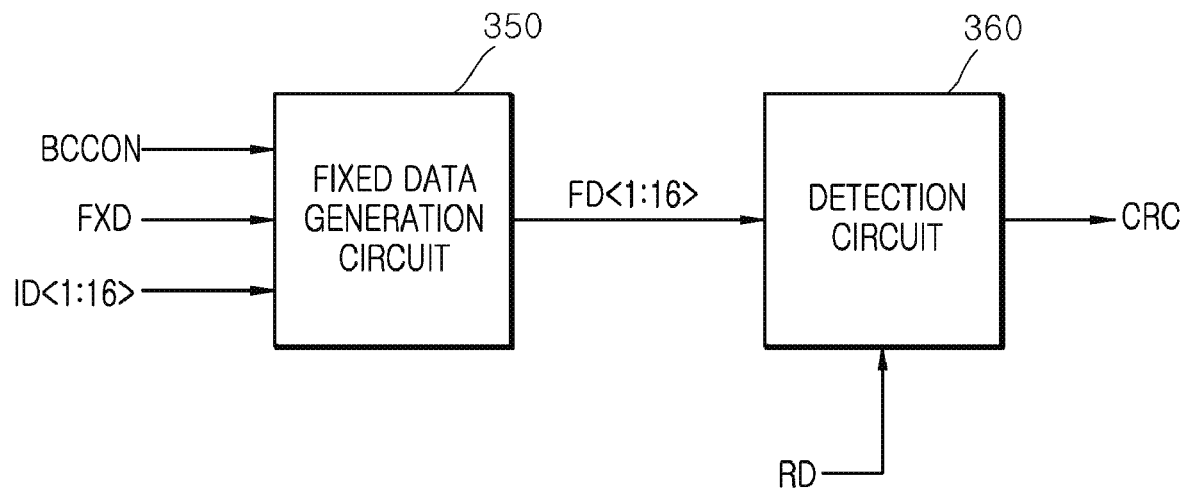
FIG. 5 is a block diagram illustrating a representation of an example of the configuration of the error check circuit included in the error detection circuit illustrated in FIG. 1.

Referring to FIG. 5, the error check circuit 32 may include a fixed data generation circuit 350 and a detection circuit 360.

The fixed data generation circuit 350 may fix any one of the first group ID<1:8> and the second group ID<9:16> included in the first to sixteenth internal data ID<1:16> to the preset level depending on the operation control signal BCCON and the data control signal FXD, and thereby generate first to sixteenth fixed data FD<1:16>. In the case where the operation control signal BCCON is enabled to a logic high level and the data control signal FXD is the logic low level (the first logic level), the fixed data generation circuit 350 may fix the first group ID<1:8> of the first to sixteenth internal data ID<1:16> to the preset level (the logic low level) and thereby generate the first to sixteenth fixed data FD<1:16>. In the case where the operation control signal BCCON is enabled to the logic high level and the data control signal FXD is the logic high level (the second logic level), the fixed data generation circuit 350 may fix the second group ID<9:16> of the first to sixteenth internal data ID<1:16> to the preset level (the logic low level) and thereby generate the first to sixteenth fixed data FD<1:16>.

The detection circuit 360 may detect an error of the first to sixteenth fixed data FD<1:16> in the case where the read command RD is inputted and thereby generate the error detection signal CRC. The detection circuit 360 may generate the error detection signal CRC which is enabled, in the case where the read command RD is inputted at the logic high level and an error occurs in the first to sixteenth fixed data FD<1:16>. The detection circuit 360 may detect an error of the first to sixteenth fixed data FD<1:16> by performing a cyclic redundancy check and thereby generate the error detection signal CRC.

Figure 6:
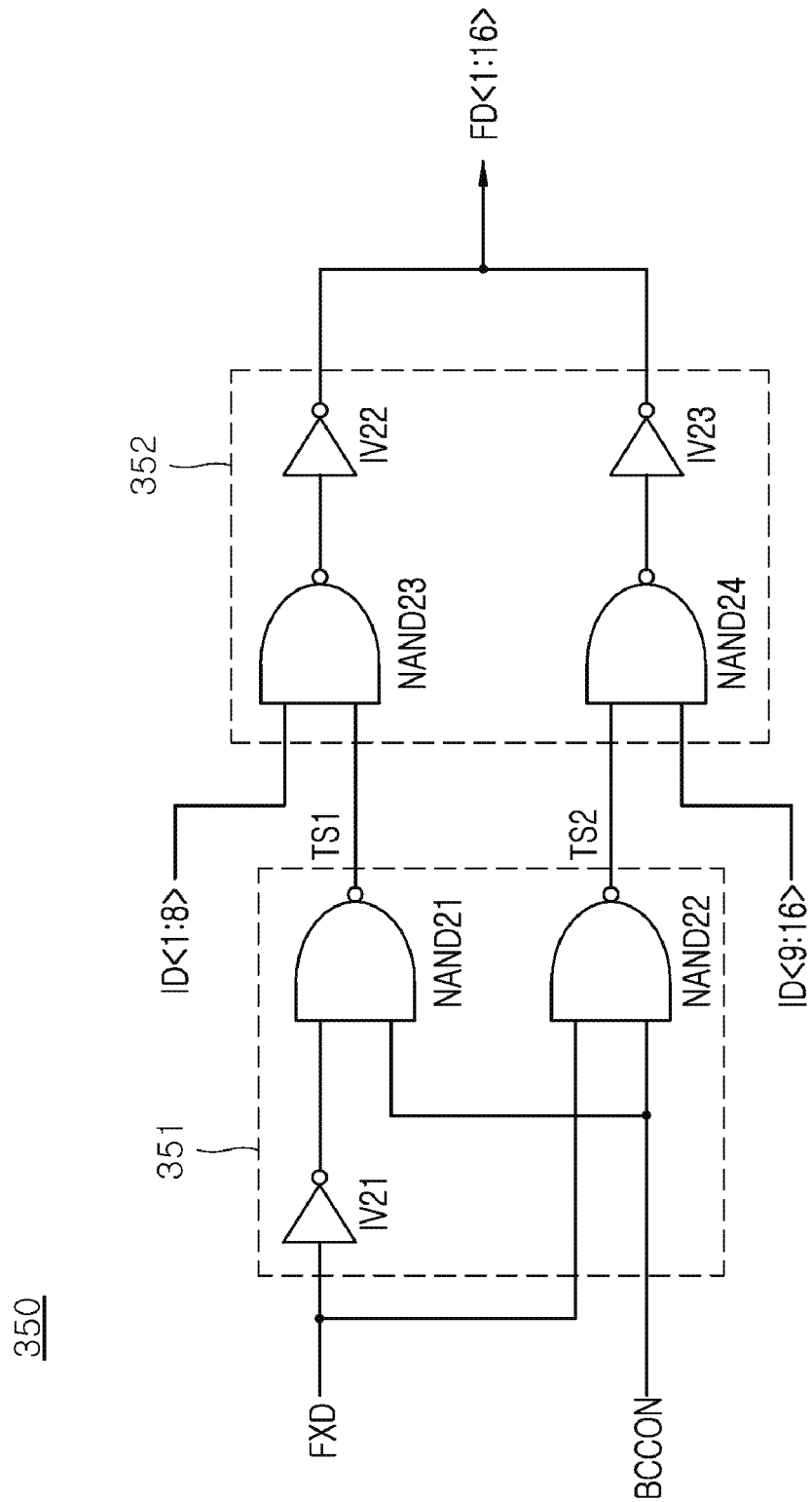
FIG. 6 is a circuit diagram illustrating a representation of an example of the configuration of the fixed data generation circuit included in the error check circuit illustrated in FIG. 5.

Referring to FIG. 6, the fixed data generation circuit 350 may include a transfer control signal generation circuit 351 and a logic circuit 352.

The transfer control signal generation circuit 351 may be realized by logic gates, for example but not limited to, an inverter IV21 and NAND gates NAND21 and NAND22. In the case where the operation control signal BCCON is enabled to the logic high level and the data control signal FXD is the logic low level (the first logic level), the transfer control signal generation circuit 351 may generate a first transfer control signal TS<1> of a logic low level and a second transfer control signal TS<2> of a logic high level. In the case where the operation control signal BCCON is enabled to the logic high level and the data control signal FXD is the logic high level (the second logic level), the transfer control signal generation circuit 351 may generate the first transfer control signal TS<1> of a logic high level and the second transfer control signal TS<2> of a logic low level.

The logic circuit 352 may be realized by logic gates, for example but not limited to, NAND gates NAND23 and NAND24 and inverters IV22 and IV23. In the case where the first transfer control signal TS<1> is the logic high level, the logic circuit 352 may buffer the first group ID<1:8> of the first to sixteenth internal data ID<1:16> and thereby output a first group FD<1:8> of the first to sixteenth fixed data FD<1:16>. In the case where the first transfer control signal TS<1> is the logic low level, the logic circuit 352 may fix the first group FD<1:8> of the first to sixteenth fixed data FD<1:16> to a preset level (a logic low level). In the case where the second transfer control signal TS<2> is the logic high level, the logic circuit 352 may buffer the second group ID<9:16> of the first to sixteenth internal data ID<1:16> and thereby output a second group FD<9:16> of the first to sixteenth fixed data FD<1:16>. In the case where the second transfer control signal TS<2> is the logic low level, the logic circuit 352 may fix the second group FD<9:16> of the first to sixteenth fixed data FD<1:16> to the preset level (the logic low level).

While the fixed data generation circuit 350 illustrated in FIG. 6 is illustrated as one circuit, the fixed data generation circuit 350 may be realized by 16 circuits in correspondence to the number of bits of the first to sixteenth internal data ID<1:16> and the first to sixteenth fixed data FD<1:16>.

Figure 7:
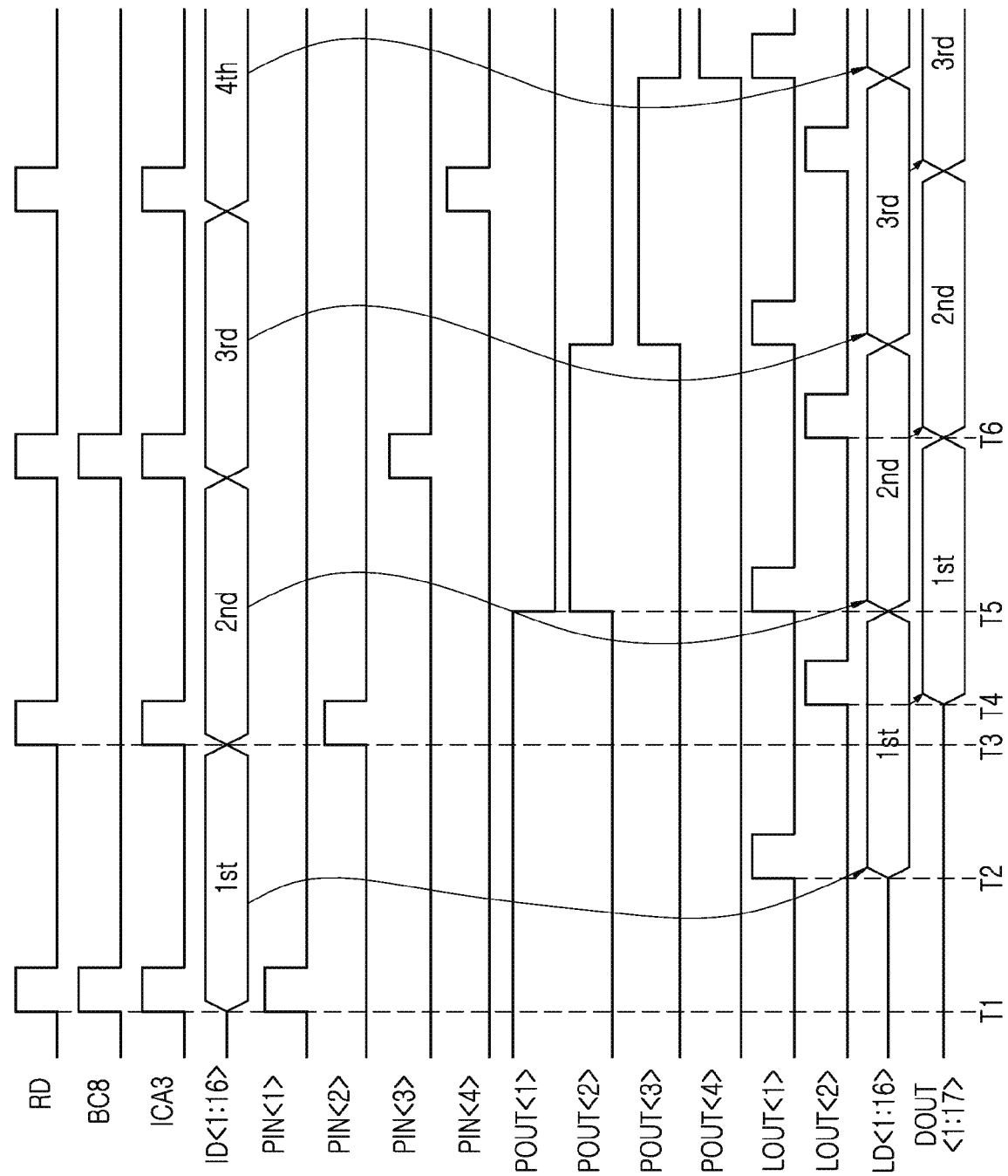
FIG. 7 is a representation of an example of a timing diagram to assist in the explanation of the operation of the semiconductor device in accordance with an embodiment of the disclosure.

The operation of the semiconductor device in accordance with an embodiment of the disclosure will be described with reference to FIG. 7, as an example in which a burst chop operation is performed during a continuous read operation.

At a time T1, the command decoder 10 decodes the chip select signal CS and the first to M^th command addresses CA<1:M> for a first read operation 1st, and thereby generates the read command RD of the logic high level and the burst chop signal BC8 of a logic high level. The command decoder 10 generates the internal command address ICA3 of a logic high level from any one among the bits included in the first to M^th command addresses CA<1:M>, in the burst chop operation.

The memory circuit 20 outputs the stored first to sixteenth internal data ID<1:16> according to the read command RD of the logic high level.

The input control signal generation circuit 310 of the error check control circuit 31 generates the first input control signal PIN<1> of the logic high level by the read command RD of the logic high level.

The output control signal generation circuit 330 of the error check control circuit 31 generates the first output control signal POUT<1> which is initialized to the logic high level, by the reset signal RST which is enabled in an initializing operation.

The latch circuit 340 of the error check control circuit 31 latches the burst chop signal BC8 and the internal command address ICA3 according to the first input control signal PIN<1> of the logic high level, and outputs the latched burst chop signal BC8 and internal command address ICA3 as the operation control signal BCCON and the data control signal FXD according to the first output control signal POUT<1> of the logic high level.

The fixed data generation circuit 350 of the error check circuit 32 fixes the second group ID<9:16> of the first to sixteenth internal data ID<1:16> to the preset level (the logic low level) according to the operation control signal BCCON of the logic high level and the data control signal FXD of the logic high level, and thereby generates the first to sixteenth fixed data FD<1:16>. At this time, the fixed data generation circuit 350 buffers the first group ID<1:8> of the first to sixteenth internal data ID<1:16>, and thereby generates the first to eighth fixed data FD<1:8>.

The detection circuit 360 of the error check circuit 32 detects an error of the first to sixteenth fixed data FD<1:16> according to the read command RD of the logic high level, and thereby generates the error detection signal CRC.

At a time T2, the shifting circuit 40 shifts the read command RD of the time T1, and thereby generates the shifting output signal SOUT and the first latch output control signal LOUT<1>.

The latch circuit 340 outputs the internal command address ICA3 of the logic high level as the delay command address CA3D by the shifting output signal SOUT of a logic high level.

The latch data generation circuit 51 latches the first to sixteenth internal data ID<1:16> generated at the time T1 by the first latch output control signal LOUT<1> of a logic high level, and thereby generates the first to sixteenth latch data LD<1:16>.

At a time T3, the command decoder 10 decodes the chip select signal CS and the first to M^th command addresses CA<1:M> for a second read operation 2nd, and thereby generates the read command RD of the logic high level and the burst chop signal BC8 of a logic low level. The command decoder 10 generates the internal command address ICA3 of a high level from any one among the bits included in the first to M^th command addresses CA<1:M>, in the burst chop operation.

The memory circuit 20 outputs the stored first to sixteenth internal data ID<1:16> according to the read command RD of the logic high level.

The input control signal generation circuit 310 of the error check control circuit 31 generates the second input control signal PIN<2> of a logic high level by the read command RD of the logic high level.

The latch circuit 340 of the error check control circuit 31 latches the burst chop signal BC8 and the internal command address ICA3 according to the second input control signal PIN<2> of the logic high level.

At a time T4, the shifting circuit 40 shifts the read command RD of the time T1, and thereby generates the second latch output control signal LOUT<2> after the read latency period.

The output data generation circuit 52 serializes the first to sixteenth latch data LD<1:16> generated at the time T2 and the error detection signal CRC according to the second latch output control signal LOUT<2> of a logic high level and the delay command address CA3D of the logic high level, and thereby generates the first to seventeenth output data DOUT<1:17>. The first to sixteenth output data DOUT<1:16> are generated from the first to sixteenth latch data LD<1:16>, and the seventeenth output data DOUT<17> is generated from the error detection signal CRC.

At a time T5, the delay circuit 320 of the error check control circuit 31 delays the read command RD of the time T3, and thereby generates the delay signal DLY.

The output control signal generation circuit 330 of the error check control circuit 31 generates the second output control signal POUT<2> of a logic high level by the delay signal DLY.

The latch circuit 340 of the error check control circuit 31 outputs the burst chop signal BC8 and the internal command address ICA3 latched at the time T3 as the operation control signal BCCON and the data control signal FXD according to the second output control signal POUT<2> of the logic high level.

The shifting circuit 40 shifts the read command RD of the time T3, and thereby generates the shifting output signal SOUT and the first latch output control signal LOUT<1>.

The latch circuit 340 outputs the internal command address ICA3 of the logic low level as the delay command address CA3D by the shifting output signal SOUT of the logic high level.

The latch data generation circuit 51 latches the first to sixteenth internal data ID<1:16> generated at the time T3 by the first latch output control signal LOUT<1> of the logic high level, and thereby generates the first to sixteenth latch data LD<1:16>.

At a time T6, the shifting circuit 40 shifts the read command RD of the time T3, and thereby generates the second latch output control signal LOUT<2> after the read latency period.

The output data generation circuit 52 serializes the first to sixteenth latch data LD<1:16> generated at the time T5 and the error detection signal CRC according to the second latch output control signal LOUT<2> of the logic high level and the delay command address CA3D of the logic low level, and thereby generates the first to seventeenth output data DOUT<1:17>.

Since operations of generating the first to seventeenth output data DOUT<1:17> through generating the third and fourth input control signals PIN<3:4> and the third and fourth output control signals POUT<3:4> in a third read operation 3rd and a fourth read operation 4th are the same as the first read operation 1st and the second read operation 2nd, descriptions thereof will be omitted herein.

As is apparent from the above descriptions, the semiconductor device in accordance with an embodiment of the disclosure may generate a signal for performing a burst chop operation from a command address in a read operation and may perform in parallel the burst chop operation and an error check operation.

Figure 8:
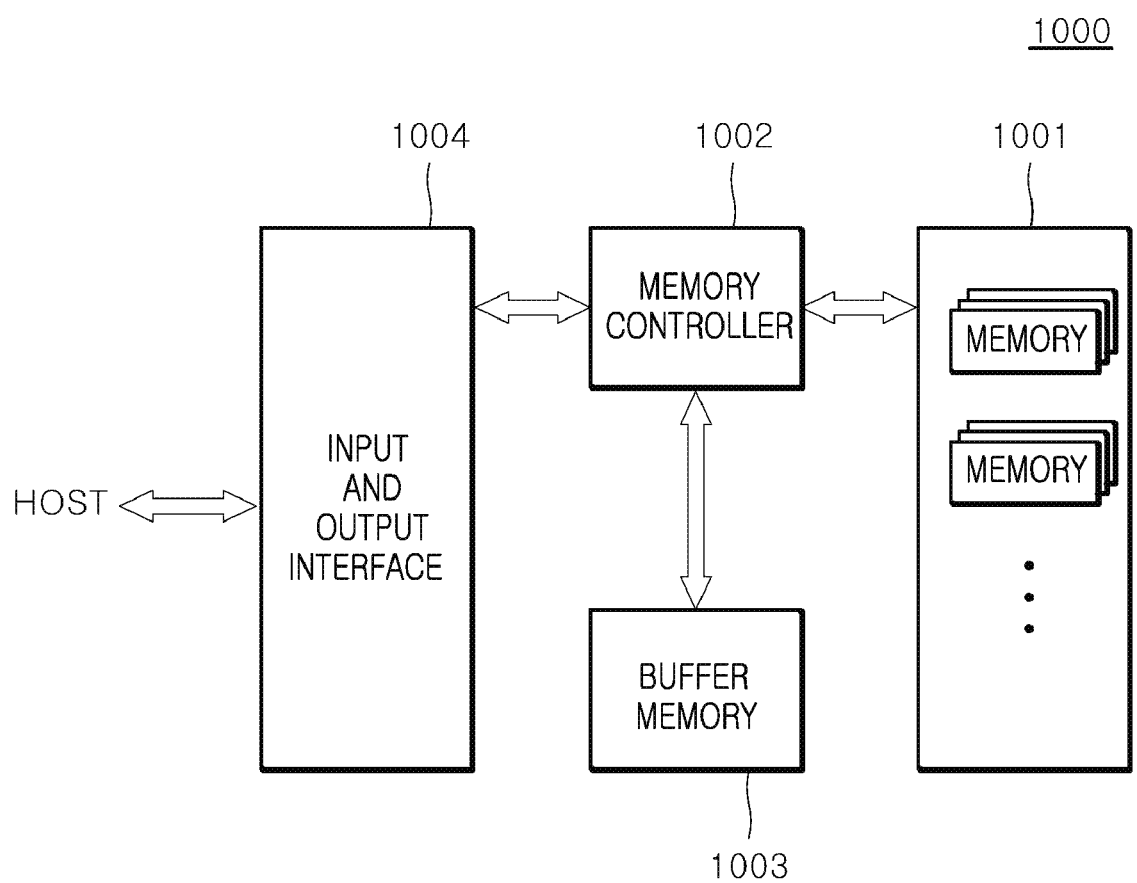
FIG. 8 is a diagram illustrating a representation of an example of the configuration of an electronic system to which the semiconductor devices illustrated in FIGS. 1 to 7 is applied, in accordance with an embodiment of the disclosure.

The semiconductor devices described above with reference to FIGS. 1 to 7 may be applied to an electronic system which includes a memory system, a graphic system, a computing system or a mobile system. For example, referring to FIG. 8, an electronic system 1000 in accordance with an embodiment of the disclosure may include data storage 1001, a memory controller 1002, a buffer memory 1003 and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor devices 1 illustrated in FIG. 1. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. The memory controller 1002 may include the first semiconductor device 1 illustrated in FIG. 1. While the memory controller 1002 is illustrated as one block in FIG. 8, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor devices described herein should not be limited based on the described embodiments.

What is claimed is:

1. A semiconductor device comprising:
   an error detection circuit configured to generate fixed data by fixing any one of a first group and a second group included in internal data to a preset level based on a burst chop signal and an internal command address in response to a read command, and generate an error detection signal based on a detection of an error within the fixed data; and
   a data output circuit configured to generate latch data by latching the internal data based on a first latch output control signal, and generate output data by serializing the latch data and the error detection signal based on a second latch output control signal.

2. The semiconductor device according to claim 1, wherein the burst chop signal is a signal which is enabled to enter a burst chop operation for fixing any one of the first group and the second group of the internal data to the preset level.

3. The semiconductor device according to claim 1, wherein the error detection circuit fixes the first group of the internal data to the preset level when the internal command address is a first logic level, and fixes the second group of the internal data to the preset level when the internal command address is a second logic level.

4. The semiconductor device according to claim 1, wherein the error detection circuit comprises:
   an error check control circuit configured to latch the burst chop signal and the internal command address based on the read command, output the latched burst chop signal and internal command address as an operation control signal and a data control signal in response to the read command, and generate a delay command address from the latched internal command address in response to a shifting output signal; and
   an error check circuit configured to detect the error within the fixed data depending on the operation control signal and the data control signal and generate a level of the error detection signal based on whether the error has been detected.

5. The semiconductor device according to claim 4, wherein the error check control circuit comprises:
   an input control signal generation circuit configured to generate first and second input control signals which are sequentially enabled from a first logic level combination, in response to the read command;
   a delay circuit configured to generate a delay signal by delaying the read command;
   an output control signal generation circuit configured to generate first and second output control signals which are sequentially enabled from a second logic level combination, in response to the delay signal; and
   a latch circuit configured to latch the burst chop signal and the internal command address based on the first and second input control signals, output the latched burst chop signal and internal command address as the operation control signal and the data control signal based on the first and second output control signals, and generate the delay command address from the latched internal command address in response to the shifting output signal.

6. The semiconductor device according to claim 5, wherein the first logic level combination is a logic level combination in which the first input control signal is set to a second logic level and the second input control signal is set to a first logic level, and the second logic level combination is a logic level combination in which the first output control signal is set to the second logic level and the second output control signal is set to the first logic level.

7. The semiconductor device according to claim 5, wherein the input control signal generation circuit comprises:
   an internal pulse generation circuit configured to generate first and second internal pulses which are initialized to the first logic level combination depending on a reset signal and are sequentially enabled from the first logic level combination in response to the read command; and
   an input control signal output circuit configured to generate the first and second input control signals by buffering the first and second internal pulses in response to the read command.

8. The semiconductor device according to claim 4, wherein the error check circuit comprises:
   a fixed data generation circuit configured to generate the fixed data by fixing any one of the first group and the second group included in the internal data to the preset level depending on the operation control signal and the data control signal; and
   a detection circuit configured to generate the error detection signal by detecting an error of the fixed data in response to the read command.

9. The semiconductor device according to claim 8, wherein the fixed data generation circuit comprises:
   a transfer control signal generation circuit configured to generate first and second transfer control signals which are selectively enabled depending on a logic level of the data control signal when the operation control signal is enabled; and
   a logic circuit configured to output a first group of the fixed data by buffering the first group of the internal data or fix the first group of the fixed data to the preset level, depending on the first transfer control signal, and output a second group of the fixed data by buffering the second group of the internal data or fix the second group of the fixed data to the preset level, depending on the second transfer control signal.

10. The semiconductor device according to claim 1, wherein the data output circuit comprises:
    a latch data generation circuit configured to generate the latch data by latching the internal data in response to the first latch output control signal; and
    an output data generation circuit configured to generate the output data by serializing the latch data and the error detection signal depending on the delay command address in response to the second latch output control signal.

11. The semiconductor device according to claim 10, wherein the first latch output control signal is a signal which is generated by shifting the read command by a period shorter than a read latency period, and the second latch output control signal is a signal which is generated by shifting the read command by the read latency period.

12. A semiconductor device comprising:
    a command decoder configured to generate a read command and a burst chop signal by decoding a chip select signal and a command address, and generate an internal command address based on the command address;
    an error detection circuit configured to fix any one of a first group and a second group included in internal data to a preset level based on the burst chop signal and the internal command address in response to the read command, and generate an error detection signal based on a detection of an error within the internal data;
    a data output circuit configured to generate output data by serializing the internal data and the error detection signal after a read latency period, and
    wherein the read latency period is set as a period that is longer than a period during which an error of the internal data is detected, from a time when the read command is generated.

13. The semiconductor device according to claim 12, wherein the internal command address is a signal which is generated from any one among a plurality of bits included in the command address.

14. The semiconductor device according to claim 12, wherein the burst chop signal is a signal which is enabled to enter a burst chop operation for fixing any one of the first group and the second group of the internal data to the preset level.

15. The semiconductor device according to claim 12, wherein the error detection circuit fixes the first group of the internal data to the preset level when the internal command address is a first logic level, and fixes the second group of the internal data to the preset level when the internal command address is a second logic level.

16. The semiconductor device according to claim 12, wherein the error detection circuit comprises:
    an error check control circuit configured to latch the burst chop signal and the internal command address based on the read command, output the latched burst chop signal and internal command address as an operation control signal and a data control signal in response to the read command, and generate a delay command address from the latched internal command address in response to a shifting output signal; and
    an error check circuit configured to detect the error within the fixed data depending on the operation control signal and the data control signal and generate a level of the error detection signal based on whether the error has been detected.

17. The semiconductor device according to claim 16, wherein the error check control circuit comprises:
    an input control signal generation circuit configured to generate first and second input control signals which are sequentially enabled from a first logic level combination, in response to the read command;
    a delay circuit configured to generate a delay signal by delaying the read command;
    an output control signal generation circuit configured to generate first and second output control signals which are sequentially enabled from a second logic level combination, in response to the delay signal; and
    a latch circuit configured to latch the burst chop signal and the internal command address based on the first and second input control signals, output the latched burst chop signal and internal command address as the operation control signal and the data control signal based on the first and second output control signals, and generate the delay command address from the latched internal command address in response to the shifting output signal.

18. The semiconductor device according to claim 17, wherein the first logic level combination is a logic level combination in which the first input control signal is set to a second logic level and the second input control signal is set to a first logic level, and the second logic level combination is a logic level combination in which the first output control signal is set to the second logic level and the second output control signal is set to the first logic level.

19. The semiconductor device according to claim 17, wherein the input control signal generation circuit comprises:
   an internal pulse generation circuit configured to generate first and second internal pulses which are initialized to the first logic level combination depending on a reset signal and are sequentially enabled from the first logic level combination in response to the read command; and
   an input control signal output circuit configured to generate the first and second input control signals by buffering the first and second internal pulses in response to the read command.

20. The semiconductor device according to claim 16, wherein the error check circuit comprises:
   a fixed data generation circuit configured to generate the fixed data by fixing any one of the first group and the second group included in the internal data to the preset level depending on the operation control signal and the data control signal; and
   a detection circuit configured to generate the error detection signal by detecting an error of the fixed data in response to the read command.

21. The semiconductor device according to claim 20, wherein the fixed data generation circuit comprises:
   a transfer control signal generation circuit configured to generate first and second transfer control signals which are selectively enabled depending on a logic level of the data control signal when the operation control signal is enabled; and
   a logic circuit configured to output a first group of the fixed data by buffering the first group of the internal data or fix the first group of the fixed data to the preset level, depending on the first transfer control signal, and output a second group of the fixed data by buffering the second group of the internal data or fix the second group of the fixed data to the preset level, depending on the second transfer control signal.

22. The semiconductor device according to claim 12, wherein the data output circuit comprises:
   a latch data generation circuit configured to generate latch data by latching the internal data in response to a first latch output control signal; and
   an output data generation circuit configured to generate the output data by serializing the latch data and the error detection signal depending on the delay command address in response to a second latch output control signal.

23. The semiconductor device according to claim 22, wherein the first latch output control signal is a signal which is generated by shifting the read command by a period shorter than a read latency period, and the second latch output control signal is a signal which is generated by shifting the read command by the read latency period.

24. The semiconductor device according to claim 22, wherein the delay command address is a signal which is generated as the internal command address is delayed.

* * * * *